(12) United States Patent
Yamamoto et al.

(10) Patent No.: US 8,766,437 B2
(45) Date of Patent: Jul. 1, 2014

(54) ELECTRODE STRUCTURE, WIRING BODY, ADHESIVE CONNECTION STRUCTURE, ELECTRONIC DEVICE, AND METHOD FOR FABRICATING SAME

(75) Inventors: Masamichi Yamamoto, Osaka (JP);
Kyouichirou Nakatsugi, Osaka (JP);
Takashi Yamaguchi, Kouga (JP);
Shigeki Kawakami, Kouga (JP);
Michihiro Kimura, Kouga (JP)

(73) Assignees: Sumitomo Electric Industries, Ltd., Osaka (JP); Sumitomo Electric Printed Circuits, Inc., Kouga-shi, Shiga (JP)

( * ) Notice: Subject to any disclaimer, the term of this patent is extended or adjusted under 35 U.S.C. 154(b) by 595 days.

(21) Appl. No.: 13/060,845

(22) PCT Filed: Apr. 13, 2010

(86) PCT No.: PCT/JP2010/056554
§ 371 (c)(1),
(2), (4) Date: Feb. 25, 2011

(87) PCT Pub. No.: WO2010/137413
PCT Pub. Date: Dec. 2, 2010

(65) Prior Publication Data
US 2011/0147048 A1    Jun. 23, 2011

(30) Foreign Application Priority Data

May 25, 2009 (JP) ................................. 2009-125462

(51) Int. Cl.
*H01L 23/48* (2006.01)
(52) U.S. Cl.
USPC .................................. 257/737; 257/E23.018

(58) Field of Classification Search
USPC .................................. 257/673, 737, E23.018
See application file for complete search history.

(56) References Cited

U.S. PATENT DOCUMENTS

| | | |
|---|---|---|
| 5,869,904 A | 2/1999 | Shoji |
| 6,042,894 A | 3/2000 | Goto et al. |

(Continued)

FOREIGN PATENT DOCUMENTS

| | | |
|---|---|---|
| CN | 1492449 A | 4/2004 |
| JP | 08-017259 | 1/1996 |

(Continued)

OTHER PUBLICATIONS

Japanese Office Action, with partial English translation, issued in Japanese Patent Application No. 2009-125462, mailed Mar. 10, 2011.

(Continued)

*Primary Examiner* — William D Coleman
(74) *Attorney, Agent, or Firm* — McDermott Will & Emery LLP

(57) ABSTRACT

There is provided an electrode structure to be electrically connected to a connection conductor by being bonded thereto with an anisotropic conductive adhesive mainly composed of a thermosetting resin, the electrode structure including an electrode for connection using an adhesive, the electrode being arranged on a base material, and an organic film serving as an oxidation preventing film configured to cover a surface of the electrode for connection using an adhesive, in which the organic film has a higher decomposition temperature than the maximum temperature of heat treatment to be performed. A wiring body and a connecting structure using an adhesive are also provided.

18 Claims, 6 Drawing Sheets

(56) References Cited

U.S. PATENT DOCUMENTS

| | | | |
|---|---|---|---|
| 6,190,578 B1 * | 2/2001 | Yokoyama et al. | 252/512 |
| 6,518,096 B2 * | 2/2003 | Chan et al. | 438/118 |
| 6,657,031 B1 * | 12/2003 | Crane et al. | 526/266 |
| 6,887,737 B1 * | 5/2005 | Woods et al. | 438/106 |
| 6,905,768 B2 * | 6/2005 | Tada et al. | 428/413 |

FOREIGN PATENT DOCUMENTS

| | | |
|---|---|---|
| JP | 10-079568 | 3/1998 |
| JP | 2000-091718 | 3/2000 |
| JP | 2002-270973 | 9/2002 |
| JP | 2003-324255 | 11/2003 |
| JP | 2006-041374 | 2/2006 |
| JP | 2007-059451 | 3/2007 |
| JP | 2008-004429 | 1/2008 |
| JP | 2008-004908 | 1/2008 |
| JP | 2008-078384 | 4/2008 |
| JP | 2008-097922 | 4/2008 |
| JP | 2009-111327 | 5/2009 |

OTHER PUBLICATIONS

Chinese Office Action, w/ English translation thereof, issued in Chinese Patent Application No. CN 201080002438.3 dated Aug. 21, 2013.

Japanese Notification of Reasons for Rejection, w/ English translation thereof, issued in Japanese Patent Application No. JP 2009-125462 dated Oct. 13, 2011.

* cited by examiner

ELECTRODE STRUCTURE, WIRING BODY, ADHESIVE CONNECTION STRUCTURE, ELECTRONIC DEVICE, AND METHOD FOR FABRICATING SAME

TECHNICAL FIELD

The present invention relates to an electrode structure in which an electrical connection is established with an adhesive, a wiring body having the electrode structure, a connecting structure using an adhesive, an electronic appliance, and an assembling method thereof.

BACKGROUND ART

In recent years, there have been advances in a reduction in the size of connection terminals in components (for example, electronic components in liquid crystal productions) due to a trend toward miniaturization and higher functionality of electronic appliances. Thus, in the field of electronics packaging, film adhesives are widely used as various anisotropic conductive adhesives capable of easily establishing connections between the terminals. For example, film adhesives are used for the joint between printed circuit boards, such as flexible printed circuit boards (FPCs) and rigid printed wiring boards (PWBs or PCBs), provided with electrodes, such as copper electrodes, for connection using adhesives and interconnection substrates, such as glass substrates, provided with wiring electrodes, such as copper electrodes, and between printed circuit boards and electronic components, such as integrated circuit (IC) chips.

An anisotropic conductive adhesive is an adhesive containing electrically conductive particles dispersed in an insulating resin composition. The anisotropic conductive adhesive is interposed between connection members, heated, and pressurized to bond the connection members to each other. That is, for example, the heating and pressurization allow a resin in the adhesive to flow to seal a gap between an electrode for connection using an adhesive formed on a surface of a printed circuit board and a wiring electrode formed on an interconnection substrate. Simultaneously, some of the electrically conductive particles are arranged between the wiring electrode and the electrode for connection using an adhesive, thereby establishing an electrical connection. Here, each of the electrode for connection using an adhesive of the printed circuit board and the wiring electrode of the interconnection substrate is generally subjected to gold plating in order to achieve prevention of oxidation and electrical conduction properties (for example, see Patent Literature 1).

SUMMARY OF INVENTION

Technical Problem

However, gold plating layers are formed after nickel plating layers are formed on surfaces of the electrode for connection using an adhesive and the wiring electrode, thus leading to a complex production process. As a result, the production cost when a flexible printed circuit board, an interconnection substrate, and so forth are connected to each other is disadvantageously increased.

It is an object of the present invention to provide an electrode structure capable of achieving a simple production process and a connecting structure using an adhesive at a low cost, a wiring body having the electrode structure, the connecting structure using an adhesive, and so forth.

Solution to Problem

An electrode structure according to the present invention is a structure to be electrically connected to a connection conductor by being bonded thereto with an adhesive mainly containing a thermosetting resin. The electrode structure includes an electrode for connection using an adhesive, the electrode being arranged on a base material, and an organic film serving as an oxidation preventing film configured to cover a surface of the electrode for connection using an adhesive. Here, the organic film has a higher decomposition temperature than the maximum temperature of heat treatment to be performed.

The heat treatment to be performed is most typically solder reflow processing.

As described below, as the adhesive, there are an anisotropic conductive adhesive and an insulating adhesive. For the electrode structure, any adhesive can be used.

Treatment for forming the organic film is generally referred to as preflux treatment (organic solderability preservation (OSP) treatment).

As the base material, there is a base film of a printed wiring board, a base member of an electrode of an electronic component, and so forth. As the connection conductor, there is an electrode of another printed wiring board, an electrode of an electronic component, an electrode of a connector, and so forth.

The present invention provides effects described below.

Hitherto, an electrode for connection using an adhesive has been subjected to gold plating for prevention of oxidation. In contrast, a step of forming the organic film by the OSP treatment leads to a simple production process, as compared with a step of forming a gold plating layer. Furthermore, disuse of expensive gold results in a reduction in material cost. According to the present invention, it is thus possible to produce the electrode structure for connection using an adhesive at low cost.

In general, an electrode for connection using solder is also arranged on the base material on which the electrode for connection using an adhesive is arranged. In that case, usually, an organic film is formed on both the electrode for connection using an adhesive and the electrode for connection using solder. Next, solder reflow processing is performed, and then connection using an adhesive is performed. This is because if the connection using an adhesive is first performed, the constriction of the adhesive is loosened during the subsequent solder reflow, so that poor connection is more likely to occur. Meanwhile, the organic film can be thermally decomposed during the solder reflow.

In the present invention, the electrode for connection using an adhesive has a higher decomposition temperature than the solder reflow temperature. Thus, the organic film remains assuredly even after the solder reflow. Hence, in the case where various base materials are each provided with the electrode for connection using an adhesive, connection using solder and connection using an adhesive can be smoothly performed.

An adhesive used for connection between the electrode for connection using an adhesive and a connection electrode is preferably an anisotropic conductive adhesive containing electrically conductive particles. The electrically conductive particles are capable of breaking through the organic film to easily contact the electrode for connection using an adhesive.

The solder reflow temperature is about 260° C. Thus, the organic film preferably has a decomposition temperature of 300° C. or higher.

Furthermore, the organic film contains an organic compound having a coordinating atom capable of forming a coordinate bond with a metal constituting the electrode for connection using an adhesive. Thus, the organic film forms a complex with the metal constituting the electrode for connection using an adhesive, thereby increasing the decomposition temperature. In particular, an organic compound having a plurality of coordinating atoms in one molecule thereof can form a bridged complex to increase the decomposition temperature, which is preferred.

Specifically, the organic film containing at least one organic compound selected from, for example, 2-phenylimidazoles, such as 2-phenyl-4-methyl-5-benzylimidazole, 2,4-diphenylimidazole, and 2,4-diphenyl-5-methylimidazole, and benzimidazoles, such as 5-methylbenzimidazole, 2-alkylbenzimidazole, 2-arylbenzimidazole, and 2-phenylbenzimidazole, is preferably used.

The organic film preferably has an average thickness of 0.05 µm to 0.5 µm. An average thickness of the organic film of less than 0.05 µm can result in a reduction in the antioxidant function of the organic film, causing oxidation of the surface of the electrode for connection using an adhesive. When the average thickness of the organic film exceeds 0.5 µm, it is difficult to cause the electrically conductive particles or the like to break through the organic film, so that the poor connection between the electrode for connection using an adhesive and the connection electrode can occur.

The area of a region of the organic film having a thickness of 0.1 µm or less is preferably 30% or more with respect to the total area of the organic film. This ensures a region where the electrically conductive particles or the like break through the organic film to establish the connection between the electrodes.

The wiring body of the present invention includes the foregoing electrode structure arranged on a wiring member. Thus, it is possible to provide the wiring body which includes the electrode structure that provides the foregoing effects and which establishes connection with another wiring board or an electronic component using an adhesive.

The wiring member includes various types of wiring, such as wiring boards, e.g., flexible printed circuit boards and rigid printed wiring boards, and cable wiring, e.g., coaxial cable wiring and flat cable wiring.

In particular, flexible printed circuit boards are contained in many electronic appliances, such as cellular phones, cameras, e.g., digital cameras and video cameras, portable audio players, portable DVD players, and portable notebook personal computers. Use of the present invention provides outstanding effects.

The connecting structure using an adhesive of the present invention is a structure in which the foregoing electrode for connection using an adhesive of the wiring body is connected to a connection conductor of a connection component using an adhesive. A portion (electrically conductive portion) of the electrode for connection using an adhesive and a portion (electrically conductive portion) of the connection are not covered with the organic film and thus are conductive with each other.

In the case where the adhesive is an insulating adhesive, one or both of a portion (e.g., a protrusion) of the electrode for connection using an adhesive and a portion (e.g., a protrusion) of the connection conductor break through the organic film, so that the electrodes are contacted to each other to conduct. In the case where the adhesive is an anisotropic conductive adhesive, electrically conductive particles break through the organic film to come into contact with both the electrodes, so that the electrodes are in a conduction state.

In the connecting structure using an adhesive of the present invention, the foregoing effects of the organic film make it possible to prevent oxidation of the electrode for connection using an adhesive and achieve the connecting structure produced at low cost.

In the connecting structure using an adhesive, preferably, the connection conductor is also an electrode for connection using an adhesive, the electrode being covered with the organic film serving as an oxidation preventing film. This eliminates the need to subject both the electrodes to noble-metal plating, such as gold plating, thereby further increasing the effect of reducing the production cost.

As the adhesive, an adhesive containing electrically conductive particles formed of a metal powder having a shape in which a plurality of metal particles are connected in the form of a chain or a needle-shaped metal powder is preferably used. This allows the electrically conductive particles to have a higher function of breaking the organic film during the production process, thereby smoothly forming the connecting structure using an adhesive.

In that case, when the electrically conductive particles each have an aspect ratio of 5 or more, the contact probability between the electrically conductive particles is increased. As a result, the connecting structure using an adhesive can be smoothly formed without increasing the blending quantity of the electrically conductive particles.

In the case where an anisotropic conductive adhesive is used, an anisotropic conductive adhesive having a film-like shape is preferably used, thereby facilitating handling of the anisotropic conductive adhesive. Furthermore, heat and pressure treatment improves workability when the connecting structure using an adhesive is formed.

In that case, more preferably, major axes of the electrically conductive particles are oriented in the thickness direction of the adhesive having a film shape. This makes it possible to maintain insulation between adjacent electrodes and between adjacent conductors and to prevent a short circuit in the planar direction of the adhesive. Meanwhile, in the thickness direction of the adhesive, many electrodes each can be independently conductively connected to a corresponding one of the conductors in one operation to achieve a low resistance.

An electronic appliance according to the present invention includes a common base material that includes the connecting structure using an adhesive and a connecting structure using solder, in which the connecting structure using solder includes conductors that are electrically connected to each other by joining the conductors using solder. Various printed circuit boards and substrates can be used as the common base material. Furthermore, a conductor, such as an electrode subjected to gold plating, may be present in a portion of the electronic appliance.

In this case, the organic film in the connecting structure using an adhesive can remain without being subjected to thermal decomposition during solder reflow for the formation of a connecting structure using solder. It is thus possible to provide the inexpensive electronic appliance including the connecting structure using an adhesive and the connecting structure using solder.

In an assembling method of the electronic appliance according to the present invention, the following procedure is used. The electrode for connection using an adhesive and the conductor for connection using solder on a base material (mother board) are covered with the organic film having a higher decomposition temperature than a solder reflow temperature. The conductor for connection using solder is joined to a connection conductor by solder reflow treatment in a non-oxidizing atmosphere containing, for example, an inert gas and hydrogen. The electrode for connection using an adhesive is bonded to a connection conductor with the adhesive by heat and pressure treatment.

According to this method, the organic film remains without being subjected to thermal decomposition even after the solder reflow treatment, thereby reliably forming the connecting structure using an adhesive. Furthermore, the connecting structure using an adhesive is formed after the formation of the connecting structure using solder, thereby avoiding a reduction in the conductivity of the connecting structure using an adhesive possibly caused by the solder reflow treatment. It is thus possible to minimize the amount of gold plating used and to assemble the electronic appliance at low cost.

In particular, preferably, a protective film is formed on the organic film before the solder reflow treatment, and the protective film is removed after the solder reflow. According to the method, the organic film remains assuredly after the solder reflow treatment.

Advantageous Effect of Invention

According to the electrode structure, the wiring body, the connecting structure using an adhesive, the electronic appliance, and the assembling method of the electronic appliance of the present invention, it is possible to achieve a simple production process and thus establish a connection using an adhesive at low production cost.

DESCRIPTION OF EMBODIMENTS

Figure 1:
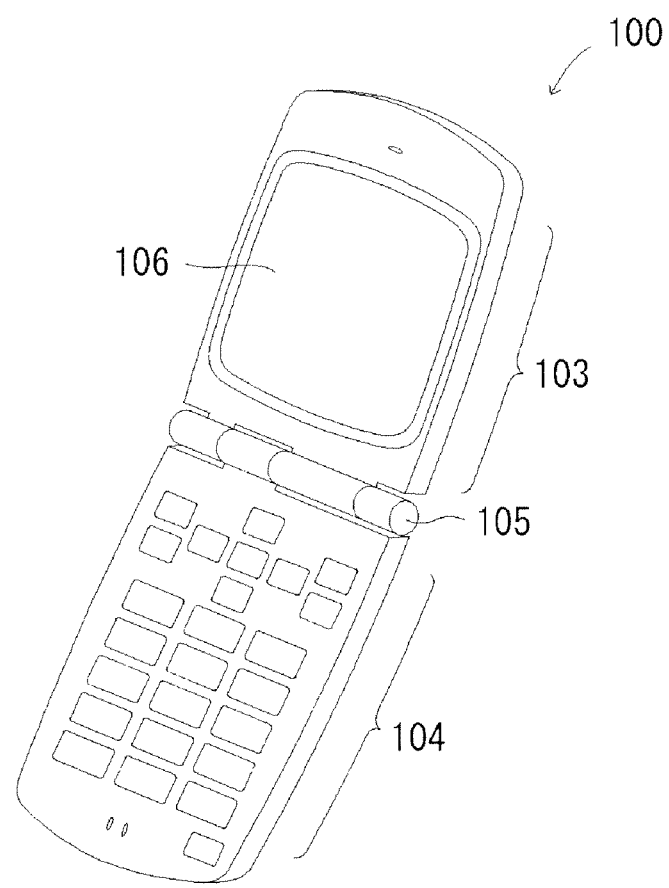
FIG. 1 is a schematic perspective view illustrating the structure of a mobile terminal serving as an electronic appliance according to an embodiment of the present invention.

Embodiments of the present invention will be described below. In the description of the drawings, the same elements are designated using the same reference numerals, and descriptions are not redundantly repeated. The ratios of dimensions in the drawings are not always the same as those of the actual objects described in the respective drawings.

—Electronic Appliance—

FIG. 1 is a schematic perspective view illustrating the structure of a mobile terminal 100 serving as an electronic appliance according to an embodiment of the present invention.

The mobile terminal 100 includes a display unit 103 configured to display various pieces of information, an input unit 104, and a hinge part 105. The display unit 103 includes a display device 106 provided with a liquid crystal display panel, a speaker, and so forth. The input unit 104 includes input keys and a microphone. The hinge part 105 rotatably connects the input unit 104 to the display unit 103.

Figure 2:
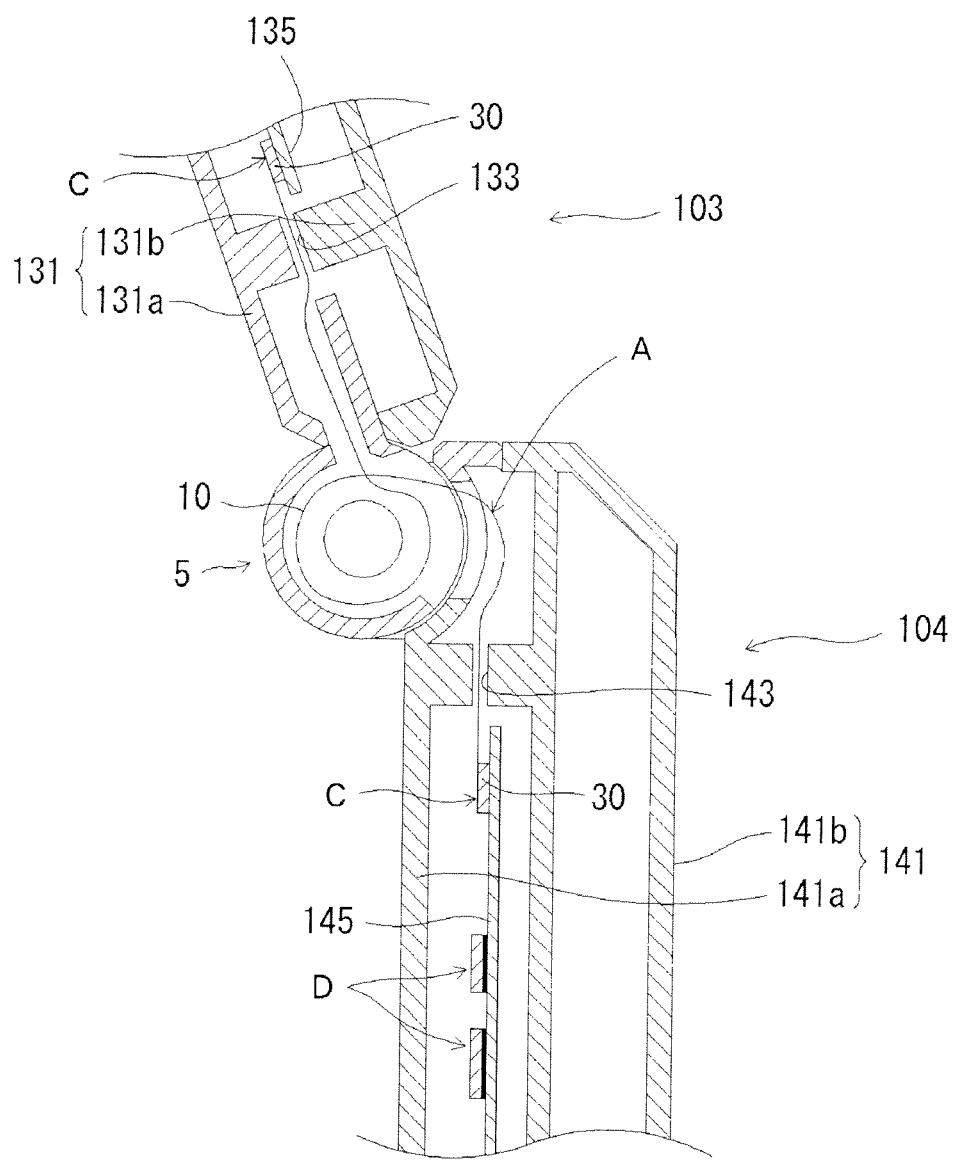
FIG. 2 is a cross-sectional view illustrating an exemplary structure of a connection part of the mobile terminal according to an embodiment.

FIG. 2 illustrates a cross section of the structure of a connection part of the mobile terminal 100 through the display unit 103 according to an embodiment.

The display unit 103 includes a display section case 131 and a display section substrate 135, which serve as main members. The display section substrate 135 includes, for example, a circuit configured to send a display signal to the display device 106. The display section case 131 includes a first case 131a and a second case 131b that are connected to each other. Furthermore, a through hole 133 is arranged between the first case 131a and the second case 131b.

The input unit 104 includes an input section case 141 and an input key board 145, which serve as main members. The input key board 145 includes, for example, a circuit configured to control a signal sent from an input key. The input section case 141 includes a first case 141a and a second case 141b that are connected to each other. Furthermore, a through hole 143 is arranged between the first case 141a and the second case 141b.

In addition, a wiring body A is arranged to connect the input key board 145 to the display section substrate 135 through the hinge part 105. The wiring body A is formed on an FPC 10 and has a connecting structure C using an adhesive with an anisotropic conductive adhesive 30.

The input key board 145 includes a connecting structure D using solder in which electronic components are joined using solder. Similarly, the display section substrate 135 includes a connecting structure D using solder in which electronic components are joined using solder (not illustrated).

—Electrode Structure and Wiring Body—

Figure 3:
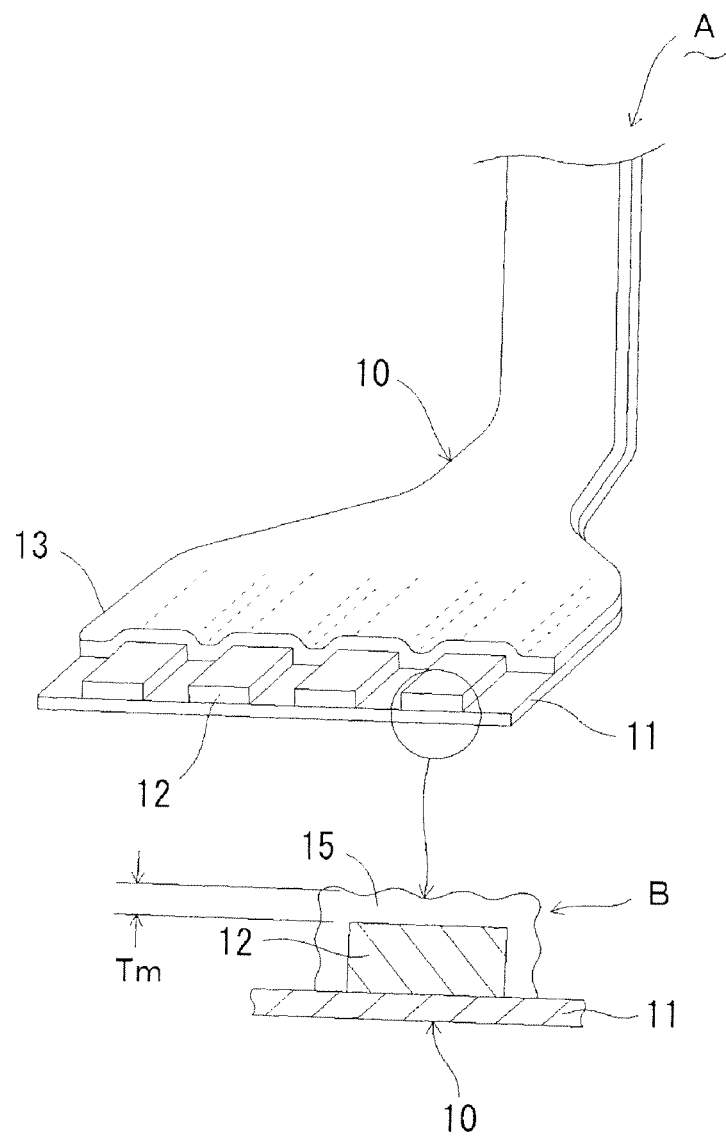
FIG. 3 is a perspective view illustrating an end portion of a wiring body before the formation of a connecting structure using an adhesive according to an embodiment.

FIG. 3 is a perspective view illustrating an end portion of the wiring body A before the formation of the connecting structure C using an adhesive according to this embodiment. The wiring body A includes the FPC 10 (base material) and an electrode structure B arranged at the end portion.

The FPC 10 generally has a structure including a base film 11 provided with circuit layers (see broken lines) and a coverlay 13 that covers the base film 11. End portions of the circuit layers are formed of electrodes 12 for connection using an adhesive, the electrodes 12 for connection using an adhesive being configured to be electrically connected to connection conductors.

Examples of a material for the base film 11 of the FPC 10 include polyimide resins, polyester resins, and glass epoxy resins. The coverlay 13 is generally composed of a material the same as a material constituting the base film. In addition, epoxy resins, acrylic resins, polyimide resins, polyurethane resins, and so forth can be used.

The circuit layers of the FPC 10 are formed by laminating metallic foil, such as copper foil, on the base film 11 and subjecting the metallic foil to lithographic exposure and etching in the usual manner. The circuit layers are generally composed of copper or a copper alloy. With respect to the circuit layers, the electrodes 12 for connection using an adhesive are exposed. In general, gold plating layers serving as oxidation preventing films for the electrodes 12 for connection using an adhesive are provided.

In contrast, for the electrode structure B according to this embodiment, a gold plating layer and another noble metal plating layer (e.g., a silver plating layer, platinum plating layer, or a palladium plating layer) are not arranged on the electrodes 12 for connection using an adhesive. The electrodes 12 for connection using an adhesive are covered with organic films 15 serving as oxidation preventing films in place of the noble metal plating layer.

The organic films 15 are formed by aqueous preflux treatment (organic solderability preservation (OSP) treatment).

Examples of a method for performing the OSP treatment include a spray method, a shower method, and a dipping method. Subsequently, washing with water and drying may be performed. In this case, the temperature of an aqueous preflux is preferably in the range of 25° C. to 40° C. The time of contact between the aqueous preflux and the electrodes 12 for connection using an adhesive is preferably in the range of 30 to 60 seconds.

In general, the aqueous preflux is an acidic aqueous solution containing an azole compound. Examples of the azole compound include azole compounds, such as imidazole, 2-undecylimidazole, 2-phenylimidazole, 2,4-diphenylimidazole, triazole, aminotriazole, pyrazole, benzothiazole, 2-mercaptobenzothiazole, benzimidazole, 2-butylbenzimidazole, 2-phenylethylbenzimidazole, 2-naphthylbenzimidazole, 5-nitro-2-nonylbenzimidazole, 5-chloro-2-nonylbenzimidazole, 2-aminobenzimidazole, benzotriazole, hydroxybenzotriazole, and carboxybenzotriazole.

In this embodiment, each of the organic films 15 has a higher decomposition temperature than the solder reflow temperature during the formation of the connecting structure D using solder. In general, a reflow temperature for lead-free solder is about 260° C. Thus, a resin with a decomposition temperature of 260° C. or higher and preferably 300° C. or higher is used for the organic films 15.

Among the foregoing azole compounds, examples of an organic compound that satisfies the requirement include 2-phenylimidazoles, such as 2-phenyl-4-methyl-5-benzyl imidazole, 2,4-diphenylimidazole, and 2,4-diphenyl-5-methylimidazole; and benzimidazoles, such as 5-methylbenzimidazole, 2-alkylbenzimidazole, 2-arylbenzimidazole, and 2-phenylbenzimidazole.

According to the electrode structure B and the wiring body A according to this embodiment, the following effects can be provided.

Hitherto, a noble metal plating layer, such as a gold plating layer, serving as an oxidation preventing film has been formed on an electrode for connection using an adhesive, in which the electrode will be connected using an anisotropic conductive adhesive or an insulating adhesive.

In contrast, in this embodiment, the electrodes 12 for connection using an adhesive are covered with the organic films 15, which is an OSP film as an alternative to the noble metal plating layer. The organic films 15 are formed by employing for example, a spray method, a shower method, or a dipping method and then performing only washing with water and drying. Thus, a process of forming an oxidation preventing film is simplified, as compared with the case of the formation of a noble metal plating layer, such as a gold plating layer. Furthermore, the material cost is reduced, as compared with the case of using a noble metal, such as gold. Moreover, it is possible to improve the connection strength (share strength) between connection electrodes and the electrodes 12 for connection using an adhesive, as compared with the case of the formation of the gold plating layer.

In general, a member to be mounted using solder is often arranged on a wiring body, such as the FPC 10. In that case, when the wiring body is passed through a solder reflow furnace after the formation of the organic films 15, the organic films 15 can be thermally decomposed.

Here, in this embodiment, the organic films 15 formed on the electrodes 12 for connection using an adhesive have a higher decomposition temperature than the solder reflow temperature. Thus, even when a substrate on which the electrodes 12 for connection using an adhesive are formed is passed through the solder reflow furnace, the organic films 15 remain assuredly without being thermally decomposed.

A base material on which the electrode structure B is formed is not limited to a flexible printed circuit board (FPC) and may be another type of wiring board, such as a rigid printed wiring board (PWB), cable wiring, an electronic component, a connector, or the like.

—First Example of Connecting Structure Using Adhesive—

Figure 4:
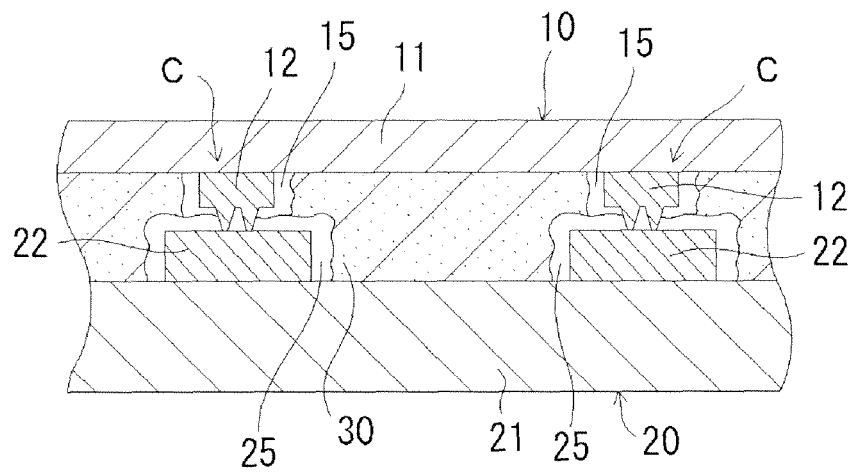
FIG. 4 is a cross-sectional view illustrating a first example of a connecting structure using an adhesive, the connecting structure being formed between a flexible printed circuit board and a mother board.

FIG. 4 is a cross-sectional view illustrating a first example of the connecting structure C using an adhesive, the connecting structure C being formed between the flexible printed circuit board (FPC) 10 and a mother board 20. The connecting structure C using an adhesive is formed with a non-conductive adhesive film (NCF).

The mother board 20 includes a rigid substrate 21 and electrodes 22 for connection using an adhesive, the electrodes 22 being arranged on the rigid substrate 21. The mother board 20 is a rigid printed wiring board (PWB) corresponding to the display section substrate 135 or the input key board 145 illustrated in FIG. 1. The FPC 10 is mounted on the mother board 20 in such a manner that the electrodes 12 for connection using an adhesive are directed below the base film 11. In this embodiment, surfaces of the electrodes 12 for connection using an adhesive and surfaces the electrodes 22 for connection using an adhesive are covered with the organic films 15 and organic films 25, except for electrically conductive portions.

The electrodes 22 for connection using an adhesive of the mother board 20 are formed by laminating metallic foil, such as copper foil, on the rigid substrate 21 subjecting the metallic foil to lithographic exposure and etching in the usual manner.

Both the electrodes 12 and 22 are tightly contacted by a constricting force of the adhesive 30, which is an NCF, and are conductive with each other.

The adhesive 30 contains a thermosetting resin, which is a main component, a curing agent, and various types of fillers. Examples of the thermosetting resin include epoxy resins, phenol resins, polyurethane resins, unsaturated polyester resins, urea-formaldehyde resins, and polyimide resins. Among these resins, in particular, the use of an epoxy resin as the thermosetting resin makes it possible to improve film-forming performance, heat resistance, and adhesion strength. The adhesive 30 may contain at least one resin, serving as a main component, selected from the foregoing thermosetting resins.

Examples of the epoxy resin that can be used include, but are not particularly limited to, bisphenol A-, F-, S-, and AD-type epoxy resins, copolymer-type epoxy resins of bisphenol A-types and bisphenol F-types, naphthalene-type epoxy resins, novolac-type epoxy resins, biphenyl-type epoxy resins, and dicyclopentadiene-type epoxy resins. Furthermore, phenoxy resins, which are high molecular weight epoxy resins, may also be used.

When a connection is established, the adhesive 30 is melted by heat while the adhesive 30 is pressurized toward the mother board 20 at a predetermined pressure via the FPC 10 (hereinafter, referred to as "heat and pressure treatment"). Thereby, the thermosetting resin in the adhesive 30 is cured, so that the electrodes 12 and 22 of the FPC 10 and the mother board 20 are tightly contacted by a constricting force due to its contraction and are conductive with each other. In this case, a portion (electrically conductive portion) of each of the electrodes 12 for connection using an adhesive and a portion (electrically conductive portion) of each of the electrodes 22 (connection conductors) for connection using an adhesive are conductive with each other without being covered with the organic film 15 or 25.

In this embodiment, the electrodes 12 for connection using an adhesive of the FPC 10 are processed by etching so as to have rough surfaces. However, machining, such as embossing, may be employed in addition to the etching.

In the case where the electrodes 12 and 22 are covered with the organic films 15 and 25, when a protruding portion is arranged on a surface of at least one of the electrodes, the protruding portion breaks through the organic films 15 and 25. Hence, the electrodes 12 and 22 are assuredly contacted to each other. A bump may be arranged between the electrodes 12 and 22.

According to the first example, the following effects are provided in addition to the effects of the electrode structure.

For example, in the case where at least one of the FPC 10 and the mother board 20 forms the connecting structure C using an adhesive after the solder reflow process, the connection resistance between the electrodes 12 and 22 electrically connected to each other can be increased, as compared with the case where it is not passed through the solder reflow furnace. This is presumably because the organic films 15 and 25 are altered (e.g., hardened) by heating in the solder reflow furnace, so that the protruding portion of each of the electrodes 12 for connection using an adhesive is less likely to break through the organic films 15 and 25.

So, the average thickness Tm of each of the organic films 15 and 25 is set in the range of 0.05 μm to 0.5 μm. This allows the protruding portion of each electrode 12 for connection using an adhesive to easily break through the organic films 15 and 25 with the oxidation of the electrodes 12 and 22 suppressed. Thus, even if the connecting structure C using an adhesive is formed after the organic films 15 and 25 are passed through the solder reflow furnace, it is possible to assuredly minimize the electrical connection resistance between the electrodes 12 and 22.

The area of a region of each of the organic films 15 and 25 each having a thickness of 0.1 μm or less is set to 30% or more of the total area of the organic films 15 and 25, thereby increasing a region where the electrodes 12 for connection using an adhesive break through the organic films 15 and 25. Thus, even if the connecting structure C using an adhesive is formed after the organic films 15 and 25 are passed through the solder reflow furnace, it is possible to assuredly minimize the electrical connection resistance between the electrodes 12 and 22.

—Second Example of Connecting Structure Using Adhesive—

Figure 5:
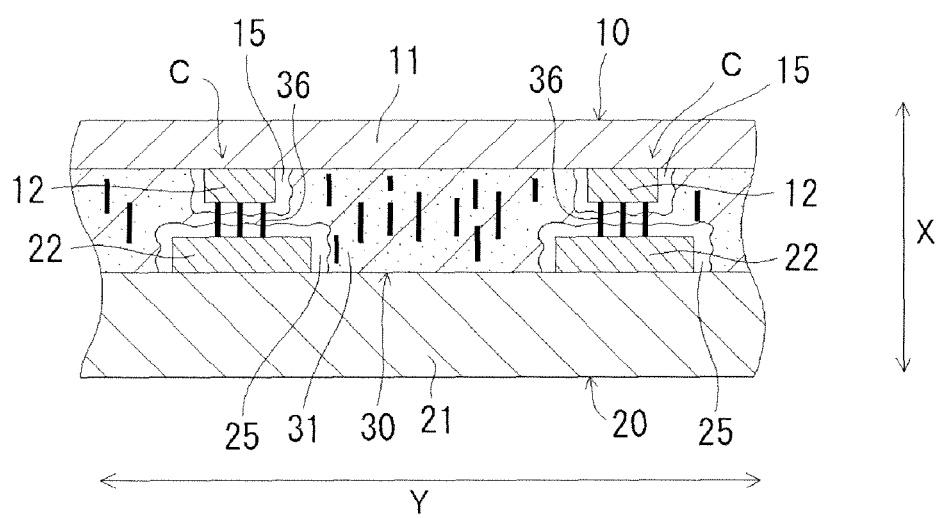
FIG. 5 is a cross-sectional view illustrating a second example of a connecting structure using an adhesive according to a second embodiment.

FIG. 5 is a cross-sectional view illustrating a second example of the connecting structure C using an adhesive. For this connecting structure C using an adhesive, the adhesive 30, which is an anisotropic conductive adhesive, is used. That is, the adhesive 30 used in this example contains electrically conductive particles 36 in a resin composition 31 mainly composed of a thermosetting resin.

Also in this example, the mother board 20 includes the rigid substrate 21 and the electrodes 22 for connection using an adhesive, the electrodes 22 being arranged on the rigid substrate 21. Also in this example, surfaces of the electrodes 12 for connection using an adhesive and surfaces the electrodes 22 for connection using an adhesive are covered with the organic films 15 and organic films 25, except for electrically conductive portions.

The electrodes 12 and 22 are electrically connected to each other through the electrically conductive particles 36. The electrically conductive particles 36 are formed of needle-shaped metal powder particles or a metal powder having a form in which many fine metal particles are connected in the form of a straight chain.

Similarly to the first example, also in this example, the electrodes 12 and 22 may be directly contacted to each other.

When a connection is established, the thermosetting resin in the adhesive 30 is cured by the heat and pressure treatment. The electrodes 12 and 22 are connected to each other through the electrically conductive particles 36 by a constricting force due to its contraction.

In this example, the electrically conductive particles 36 each having a needle shape or having a form in which many fine metal particles are connected in the form of a straight chain are contained in the resin composition 31 from the beginning.

However, electrically conductive particles formed of fine metal particles dispersed in the resin composition 31 in a random manner may be used. Like this embodiment, the electrically conductive particles 36 each having a needle shape or having a form in which many fine metal particles are connected in the form of a straight chain are preferably used.

As the anisotropic conductive adhesive used in the second example, a commonly used adhesive, i.e., an adhesive containing the electrically conductive particles 36 dispersed in a resin composition mainly composed of an insulating thermosetting resin, such as an epoxy resin, may be used. For example, an adhesive in which electrically conductive powder particles of, for example, nickel, copper, silver, gold, or graphite, are dispersed in an epoxy resin is exemplified. Here, examples of the thermosetting resin include epoxy resins, phenol resins, polyurethane resins, unsaturated polyester resins, urea-formaldehyde resins, and polyimide resins. Among these resins, in particular, the use of an epoxy resin as the thermosetting resin makes it possible to improve the film-forming performance, heat resistance, and adhesion strength of the anisotropic conductive adhesive. The anisotropic conductive adhesive may contain at least one resin, serving as a main component, selected from the foregoing thermosetting resins.

Examples of the epoxy resin that can be used include, but are not particularly limited to, bisphenol A-, F-, S-, and AD-type epoxy resins, copolymer-type epoxy resins from bisphenol A-types and bisphenol F-types, naphthalene-type epoxy resins, novolac-type epoxy resins, biphenyl-type epoxy resins, and dicyclopentadiene-type epoxy resins. Furthermore, phenoxy resins, which are high molecular weight epoxy resins, may also be used.

The molecular weight of the epoxy resin may be appropriately selected in view of the performance of the anisotropic conductive adhesive required. In the case where an epoxy resin with a higher molecular weight is used, the epoxy resin has high film-forming performance and a high viscosity at a connection temperature, thereby providing the effect in which a connection can be established without disturbing the orientation of the electrically conductive particles. Meanwhile, use of an epoxy resin with a low molecular weight provides the effect of increasing the crosslink density to improve the heat resistance. Furthermore, the effect of causing a rapid reaction with the foregoing curing agent during heating to enhance the adhesion performance is provided. Thus, the use of a combination of a high-molecular-weight epoxy resin having a molecular weight of 15,000 or more and a low-molecular-weight epoxy resin having a molecular weight of 2000 or less is preferred because of a good performance balance. The blending quantities of the high-molecular-weight epoxy resin and the low-molecular-weight epoxy resin may be appropriately selected. The term "molecular weight" used here indicates a weight-average molecular weight in terms of polystyrene determined by gel permeation chromatography using a developing solvent consisting of tetrahydrofuran.

Furthermore, an adhesive containing a latent hardener may be used as the adhesive 30 used in this example and the first example. Although the latent hardener has excellent storage stability at a low temperature and is much less likely to cause a curing reaction at room temperature, the latent hardener rapidly causes the curing reaction by heat, light, or the like. Examples of the latent hardener include hardeners of amine types, such as imidazole types, boron trifluoride-amine complexes, amine imides, polyamine types, tertiary amines, and alkyl urea types, dicyandiamide types, acid anhydride types, phenol types, and modified materials thereof. These may be used separately or in combination as a mixture of two or more.

Among these latent hardeners, imidazole type latent hardeners are preferably used from the viewpoint of excellent storage stability at low temperatures and fast curing. Known imidazole type latent hardeners may be used as the imidazole type latent hardeners. More specifically, adducts of imidazole compounds and epoxy resins are exemplified. Examples of imidazole compounds include imidazole, 2-methylimidazole, 2-ethylimidazole, 2-propylimidazole, 2-dodecylimidazole, 2-phenylimidazole, 2-phenyl-4-methylimidazole, and 4-methylimidazole.

In particular, microencapsulated latent hardeners each formed by coating a corresponding one of the foregoing latent hardeners with a high molecular material of, for example, polyurethane type or polyester type, or with a metal thin film composed of nickel or copper and an inorganic substance, such as calcium silicate, are preferred because they are able to successfully strike a balance between long shelf life and fast curing, which are a trade-off relationship. Thus, microencapsulated imidazole type latent hardeners are particularly preferred.

According to the second example, the following effects are provided in addition to the effects of the electrode structure.

For example, in the case where at least one of the FPC 10 and the mother board 20 forms the connecting structure C using an adhesive after the solder reflow process, the connection resistance between the electrodes 12 and 22 electrically connected to each other can be increased, as compared with the case where it is not passed through the solder reflow furnace. This is presumably because the organic films 15 and 25 are altered (e.g., hardened) by heating in the solder reflow furnace, so that the electrically conductive particles 36 are less likely to break through the organic films 15 and 25.

So, the average thickness Tm of each of the organic films 15 and 25 is set in the range of 0.05 µm to 0.5 µm. This allows the electrically conductive particles 36 to easily break through the organic films 15 and 25 with the oxidation of the electrodes 12 and 22 suppressed. Thus, even if the connecting structure C using an adhesive is formed after the organic films 15 and 25 are passed through the solder reflow furnace, it is possible to more assuredly minimize the electrical connection resistance between the electrodes 12 and 22.

The area of a region of each of the organic films 15 and 25 each having a thickness of 0.1 µm or less is set to 30% or more of the total area of the organic films 15 and 25, thereby increasing a region where the electrically conductive particles 36 break through the organic films 15 and 25. Thus, even if the connecting structure C using an adhesive is formed after the organic films 15 and 25 are passed through the solder reflow furnace, it is possible to more assuredly minimize the electrical connection resistance between the electrodes 12 and 22.

In the case where the adhesive having the form illustrated in FIG. 5 is used as the anisotropic conductive adhesive, in particular, the following configuration may be used.

Figure 6:
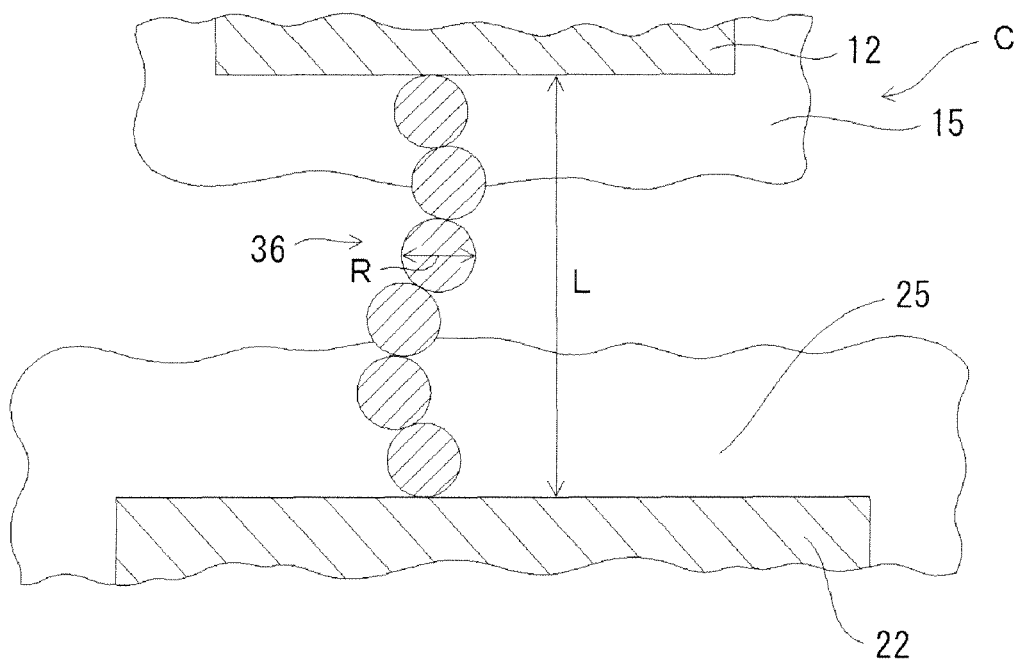
FIG. 6 is an explanatory drawing illustrating the ratio of the major axis to the minor axis of electrically conductive particles.

Specifically, the anisotropic conductive adhesive containing, for example, the foregoing insulating thermosetting resin, such as an epoxy resin, serving as a main component, and the electrically conductive particles 36 dispersed therein may be used, the electrically conductive particles 36 being formed of a high-aspect-ratio metal powder having a needle shape or having a form in which many fine metal particles (fine metal particles such as spherical metal particles or spherical resin particles plated with a metal) are connected in the form of a straight chain. The term "aspect ratio" used herein indicates the ratio of the major axis L (the length of each of the electrically conductive particles 36) to the minor axis R of a corresponding one of electrically conductive particles 36 (the length of the cross section of the corresponding electrically conductive particles 36) as shown in FIG. 6.

Use of the electrically conductive particles 36 maintains the insulation between adjacent electrodes to prevent a short circuit with respect to the planar direction (a direction that is in a direction perpendicular to the thickness direction X and indicated by an arrow Y illustrated in FIG. 5) of the anisotropic conductive adhesive, and electrically connects each of many electrodes 22 for connection using an adhesive to a corresponding one of the electrodes 12 for connection using an adhesive in one operation with respect to the thickness direction X, thereby resulting in a low resistance.

The anisotropic conductive adhesive in which the major axes L of the electrically conductive particles 36 are oriented in the thickness direction X of the film-like anisotropic conductive adhesive by passing the anisotropic conductive adhesive through a magnetic field applied in the thickness direction X at the time of the formation of the film-like anisotropic conductive adhesive, is preferably used. This orientation further improves the foregoing effect of maintaining the insulation between adjacent electrodes to prevent a short circuit and of electrically connecting each of many electrodes 22 for connection using an adhesive to a corresponding one of the electrodes 12 for connection using an adhesive in one operation.

Preferably, the metal powder used in the present invention partially contains a ferromagnetic substance. The metal powder is preferably composed of any one of ferromagnetic elemental metals, two or more component ferromagnetic alloys, alloys of ferromagnetic metals and the other metals, and complexes containing ferromagnetic metals. This is because the use of the ferromagnetic metal permits the metal particles to be oriented by the use of a magnetic field owing to the magnetism of the metal itself. Examples thereof include nickel, iron, cobalt, and two or more component alloys containing thereof.

Each of the electrically conductive particles 36 preferably has an aspect ratio of 5 or more. The use of the electrically conductive particles 36 increases the contact probability between the electrically conductive particles 36 and the electrodes 12 and 22 when the anisotropic conductive adhesive is used as the adhesive 30. It is thus possible to electrically connect the electrodes 12 and 22 to each other without increasing the blending quantity of the electrically conductive particles 36.

The aspect ratio of each of the electrically conductive particles 36 is directly measured by, for example, observation with a charge-coupled device (CCD) microscope. For the case where each of the electrically conductive particles 36 has a noncircular cross section, the maximum length of the cross section is defined as the minor axis, and then the aspect ratio is determined. Each of the electrically conductive particles 36 need not necessarily have a straight shape. Even if they are slightly curved or branched, they can be used without problems. In this case, the maximum length of each of the electrically conductive particles 36 is defined as the major axis, and then the aspect ratio is determined.

Each of the organic films 15 and 25 preferably has an average thickness Tm of 0.05 μm to 0.5 μm. In particular, in this embodiment, the average thickness Tm of each of the organic films 15 and 25 is set to 0.3 μm. In the case where each of the organic films 15 and 25 has an average thickness Tm of less than 0.05 μm, the organic films 15 and 25 may not sufficiently protect the oxidation of surfaces of the electrodes 12 and 22, thereby leading to an increase in the connection resistance between the electrodes 12 and 22. Meanwhile, in the case where each of the organic films 15 and 25 has an average thickness Tm exceeding 0.5 μm, although the organic films 15 and 25 assuredly prevent the oxidation of surfaces of the electrodes 12 and 22, the electrical conduction between the electrodes 12 and 22 is not ensured, in some cases. That is, when each of the organic films 15 and 25 has an average thickness Tm exceeding 0.5 μm, the electrically conductive particles 36 of the anisotropic conductive adhesive cannot break through the organic films 15 and 25, in some cases. In that case, the electrodes 12 and 22 cannot be electrically connected to each other with the anisotropic conductive adhesive.

The area of a region of each of the organic films 15 and 25 having a thickness of 0.1 μm or less is preferably 30% or more of the total area of the organic films. In the case where the area of the region of each of the organic films 15 and 25 having a thickness of 0.1 μm or less is 30% or more of the total area of the organic films, the electrically conductive particles 36 assuredly break through the organic films 15 and 25 to ensure a region where the particles are in contact with the electrodes 12 and 22.

—Assembling Method of Electronic Component—

Figure 7A:
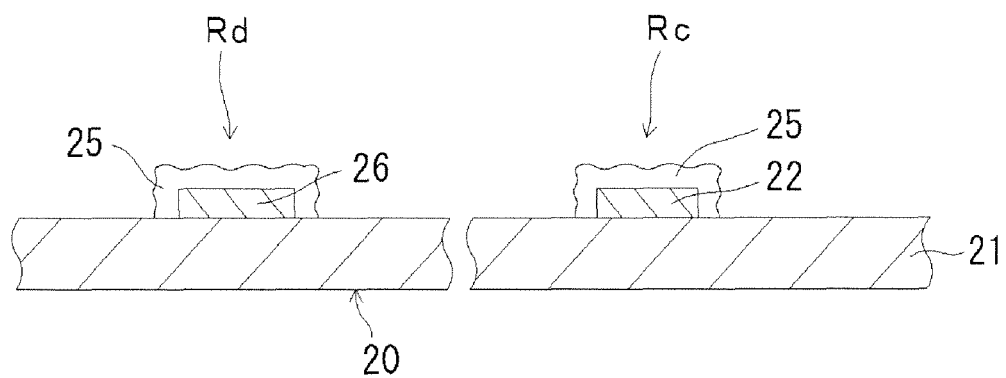
FIG. 7A is a cross-sectional view illustrating a step A in an assembling method of an electronic component including a connecting structure using an adhesive and a connecting structure using solder.
Figure 7B:
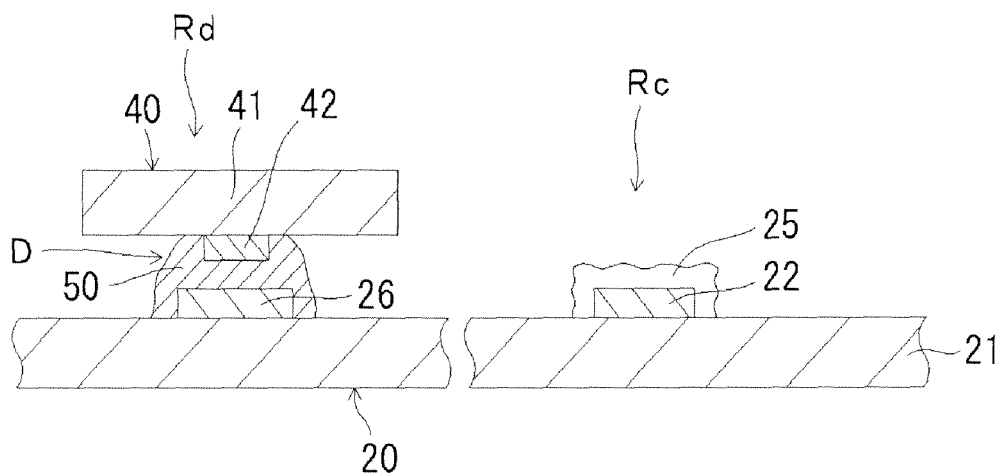
FIG. 7B is a cross-sectional view illustrating a step B in the assembling method of the electronic component including the connecting structure using an adhesive and the connecting structure using solder.
Figure 7C:
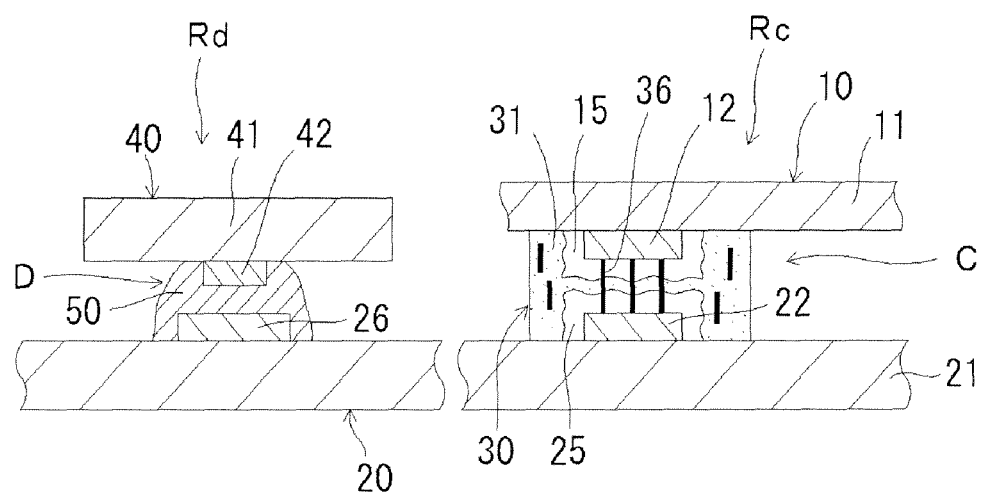
FIG. 7C is a cross-sectional view illustrating a step C in the assembling method of the electronic component including the connecting structure using an adhesive and the connecting structure using solder.

FIGS. 7A to 7C are each a cross-sectional view illustrating the procedure of an assembling method of an electronic component having the connecting structure C using an adhesive and the connecting structure D using solder.

In a step A illustrated in FIG. 7A, the mother board 20 (common base material) including a region Rc for connection using an adhesive and a region Rd for connection using solder is prepared. In the mother board 20, the electrode 22 for connection using an adhesive is provided in the region Rc for connection using an adhesive, and an electrode 26 for connection using solder is provided in the region Rd for connection using solder.

Next, the organic films 25 are formed so as to cover an electrode 22 for connection using an adhesive and an electrode 26 for connection using solder. The material and thickness of each organic film 25 are as described above. In particular, it is important that each organic film 25 has a higher decomposition temperature than the solder reflow temperature.

Although not illustrated in FIG. 7A, at this point, a protective film configured to cover the organic film 25 may be formed only in the region Rc for connection using an adhesive. (Step D) Specifically, the organic film 25 is covered with, for example, an adhesive tape. A protective film other than the adhesive tape may be used.

Next, in a step B illustrated in FIG. 7B, an electronic component 40 having a chip-side electrode 42 located in a portion of a chip 41 is arranged in the region Rd for connection using solder. At this point, the chip-side electrode 42 is aligned with the electrode 26 for connection using solder, and lead-free solder is provided between the electrodes 26 and 42. Then the mother board 20 and the electronic component 40 are placed in a solder reflow furnace having a peak temperature of about 260° C. to reflow the solder. Thus, the electrodes 26 and 42 are joined to each other through a solder layer 50 to electrically connect the electrodes 26 and 42 to each other.

Thereby, the connecting structure D using solder is formed in the region Rd for connection using solder.

Next, in the step C illustrated in FIG. 7C, the electrode 22 for connection using an adhesive and the electrode 12 for connection using an adhesive of the FPC 10 are bonded to each other using the adhesive 30 to establish an electrical connection. The electrode 12 for connection using an adhesive on the FPC 10 is covered with the organic film 15 before the step C illustrated in FIG. 7C. A procedure of forming the connecting structure C using an adhesive is as described in the foregoing second example of the connecting structure using an adhesive (see FIG. 5).

In the case where a protective film (e.g., an adhesive material) configured to cover the organic film 25 is formed in the step A illustrated in FIG. 7A, the protective film is removed (step E) before the bonding with the adhesive 30 is performed.

Thereby, the connecting structure C using an adhesive is formed in the region Rc for connection using an adhesive.

As described above, the adhesive 30 containing the electrically conductive particles 36 (anisotropic conductive adhesive) is mainly composed of a thermosetting resin. Thus, when the anisotropic conductive adhesive is heated, the anisotropic conductive adhesive is temporarily softened. When the heating is continued, the anisotropic conductive adhesive is cured. After a predetermined curing time of the anisotropic conductive adhesive, a pressurized state and a state in which the curing temperature of the anisotropic conductive adhesive is maintained are released, and then cooling is started. Thereby, the electrodes 12 and 22 are connected to each other through the electrically conductive particles 36 in the anisotropic conductive adhesive 30 to mount the FPC 10 on the mother board 20.

FIGS. 7A to 7C illustrate an example of the formation of the connecting structure C using an adhesive and the connecting structure D using solder on the mother board 20 serving as a PWB.

Alternatively, the FPC 10 may be used as a common base material, and the connecting structure C using an adhesive and the connecting structure D using solder may be formed on the FPC 10. In that case, the mother board 20 illustrated in FIGS. 7A to 7C is replaced with the FPC 10, and the organic film 15 is formed on the electrode 12 for connection using an adhesive. The procedure is as described above.

Note that there are a single-sided circuit structure and a double-sided circuit structure in FPCs. For the FPC having the double-sided circuit structure, the FPC is passed through the solder reflow furnace twice.

In the assembling method of an electronic component according to this embodiment, the following effects are provided in addition to the effects of the electrode structure B and the connecting structure C using an adhesive.

Usually, in the case where connection using solder and connection using an adhesive are performed on the same substrate, after the organic films 25 are formed on the electrode 26 for connection using solder and the electrode 22 for connection using an adhesive, the connection using solder is performed, followed by the connection using an adhesive. This is because if the connection using an adhesive is first performed, the constriction of the adhesive is loosened during the subsequent solder reflow, so that poor connection is more likely to occur. Meanwhile, the organic film can be thermally decomposed during the solder reflow.

In the assembling method of an electronic component according to this embodiment, in the step A illustrated in FIG. 7A, the organic film 25 formed on the electrode 22 for connection using an adhesive has a higher decomposition temperature than the solder reflow temperature. Thus, also in the step B illustrated in FIG. 7B, the organic film 25 remains assuredly without being thermally decomposed.

Note that the formation of a protective film on the organic film 25 permits the organic film 25 to remain more assuredly. It is thus possible to more assuredly form the connecting structure D using solder and the connecting structure C using an adhesive.

With respect to the organic film 25 covering the electrode 26 for connection using solder, although the organic film 25 has a higher decomposition temperature than the solder reflow temperature, the organic film 25 reacts with, for example, flux contained in the lead-free solder to dissolve into the solder layer 50. Thus, the connecting structure D using solder is formed without any problem.

Gold plating need not necessarily be performed on the electrode 26 for connection using solder. However, in order to prevent tarnishing and so forth, gold plating is generally performed.

In this embodiment, there is no need to perform gold plating on any electrode of the mother board 20. As described above, the organic film 25 reacts with the flux to dissolve into the solder layer 50. Thus, the organic film 25 may be formed on the electrode 26 for connection using solder by the OSP treatment as an alternative to the gold plating. It is therefore possible to significantly enhance the effect of reducing the production cost described above.

Furthermore, the formation of the organic film 25 serving as an oxidation preventing film on the electrode 26 for connection using solder results in improvement in the connection strength (share strength) between the electrodes 26 and 42.

Meanwhile, in the case where the connecting structure C using an adhesive is formed after the solder reflow process, the connection resistance between the electrodes 12 and 22 electrically connected to each other can be increased, as compared with the case where it is not passed through the solder reflow furnace. This is presumably because the organic film 25 is altered (e.g., hardened) by heating in the solder reflow furnace, so that the electrically conductive particles 36 are less likely to break through the organic film 25.

So, the average thickness Tm of the organic film 25 is set in the range of 0.05 μm to 0.5 μm. This allows the electrically conductive particles 36 to easily break through the organic films 15 and 25 with the oxidation of the electrodes 12 and 22 suppressed. Thus, even if the connecting structure C using an adhesive is formed after the organic films 15 and 25 are passed through the solder reflow furnace, it is possible to more assuredly minimize the electrical connection resistance between the electrodes 12 and 22.

The area of a region of each of the organic films 15 and 25 each having a thickness of 0.1 μm or less is set to 30% or more of the total area of the organic films 15 and 25, thereby ensuring a region where the electrically conductive particles 36 can assuredly break through the organic film 25. Thus, even if the connecting structure C using an adhesive is formed after the organic films 15 and 25 are passed through the solder reflow furnace, it is possible to more assuredly minimize the electrical connection resistance between the electrodes 12 and 22.

In summary, in this embodiment, the following effects are provided.

(1) In the connecting structure C using an adhesive according to this embodiment, the surfaces of the electrodes 22 for connection using an adhesive of the mother board 20 and the surfaces of the electrodes 12 for connection using an adhesive of the FPC 10 are subjected to the OSP treatment to form the organic films 15 and 25 serving as oxidation preventing films. According to this structure, a process of forming an oxidation preventing film is simplified, as compared with the case where the electrodes 12 and 22 are covered with gold plating layers. Furthermore, the material cost is reduced, as compared with the case of using a noble metal, such as gold. It is thus possible to connect the electrodes 12 and 22 to each other at low production cost.

Furthermore, the average thickness Tm of each of the organic films 15 and 25 is set in the range of 0.05 μm to 0.5 μm. Since each of the organic films 15 and 25 has an average thickness Tm of 0.05 μm or more, it is possible to suppress an increase in the connection resistance between the electrodes 12 and 22 attributed to the oxidation of the surfaces of the electrodes 12 and 22. Meanwhile, since each of the organic films 15 and 25 has an average thickness Tm of 0.5 μm or less, the electrically conductive particles 36 easily break through the organic films 15 and 25. It is thus possible to suppress the degradation in the electrical conduction properties between the electrodes 12 and 22 due to the fact that the electrically conductive particles 36 do not break through the organic films 15 and 25.

(2) In this embodiment, the electrically conductive particles 36 in the adhesive 30, which is an anisotropic conductive adhesive, are formed of needle-shaped metal powder particles or a metal powder having a form in which many fine metal particles are connected in the form of a straight chain. According to this structure, the insulation between adjacent electrodes 22 for connection using an adhesive or between adjacent electrodes 12 for connection using an adhesive is maintained to prevent a short circuit with respect to the Y direction, which is the planar direction of the adhesive 30. Furthermore, each of many electrodes 22 for connection using an adhesive is connected to a corresponding one of the electrodes 12 for connection using an adhesive in one operation with respect to the X direction, which is the thickness direction of the adhesive 30, thereby resulting in a low resistance.

(3) In this embodiment, each of the electrically conductive particles 36 has an aspect ratio of 5 or more. According to this structure, when the anisotropic conductive adhesive is used, the contact probability between the electrically conductive particles 36 is increased. It is thus possible to facilitate electrical connection between the electrodes 12 and 22 without increasing the blending quantity of the electrically conductive particles 36.

(4) In this embodiment, an adhesive having a film-like shape is used as the adhesive 30 (anisotropic conductive adhesive) before the formation of the connecting structure C using an adhesive. According to this structure, the anisotropic conductive adhesive is easily handled. Furthermore, the heat and pressure treatment improves workability when the connecting structure C using an adhesive is formed.

(5) In this embodiment, major axes of the electrically conductive particles 36 are oriented in the X direction, which is the thickness direction of the adhesive 30 (anisotropic conductive adhesive) having a film-like shape. According to this structure, the insulation between adjacent electrodes 22 for connection using an adhesive or between adjacent electrodes 12 for connection using an adhesive is maintained to prevent a short circuit with respect to the Y direction, which is the planar direction of the adhesive 30. Furthermore, each of many electrodes 22 for connection using an adhesive is connected to a corresponding one of the electrodes 12 for connection using an adhesive in one operation with respect to the X direction, which is the thickness direction of the adhesive 30, thereby resulting in a low resistance.

(6) In this embodiment, the flexible printed circuit board (FPC 10) is connected to the rigid printed board (PWB), which is the mother board 20. According to this structure, it is possible to provide a multi layer conductive pattern structure at low cost, as compared with the case where the mother board 20 is an FPC. Furthermore, since the FPC 10 is connected onto the mother board 20, as illustrated in FIG. 2, the flexibility of arrangement of another substrate can be improved when the FPC 10 is connected to a connector of another substrate, as compared with the case where a rigid printed wiring board is connected thereto in place of the FPC 10. In addition, the electrodes 12 and 22 are covered with the organic films 15 and 25 at low cost compared with that in the case where the electrodes 12 and 22 are covered with gold plating films. It is thus possible to provide a connection body of the mother board 20 and the FPC 10 at low cost.

The foregoing embodiment may be changed as described below.

In the foregoing embodiment, while the rigid printed board (PWB) is used as the mother board 20, another structure may be used. For example, a flexible printed circuit board may be used as the mother board 20.

In the foregoing embodiment, while the connecting structure C using an adhesive is used to connect the electrode of the FPC 10 to the electrode of the mother board 20, which is a PWB, the connecting structure using an adhesive of the present invention is not limited thereto. For example, the connecting structure C using an adhesive may be used to connect a protruding electrode (or a bump), serving as a conductor, of an electronic component, such as an IC chip, to an electrode on a PWB or FPC.

A PWB may be mounted on the mother board 20 in place of the FPC 10 according to the foregoing embodiment. Furthermore, an electronic component may be mounted in place of the FPC 10.

While the electrodes 12 and 22 are subjected to the aqueous preflux treatment serving as the OSP treatment in the foregoing embodiment, heat-resistant preflux treatment may be performed as the OSP treatment. Furthermore, while the acidic aqueous solution containing an azole compound is used in the aqueous preflux treatment, another aqueous solution may be used.

In the foregoing embodiment, both the electrodes 12 and 22 for connection using an adhesive are subjected to the OSP treatment. However, for example, only one of the electrodes 12 and 22 for connection using an adhesive may be subjected to the OSP treatment. In such a case, a noble metal plating layer, such as a gold plating layer, is formed on the other electrode 22 or 12 for connection using an adhesive. In this case, it is also possible to provide the effect (1) of the foregoing embodiment.

In the foregoing embodiment, while the organic films 15 and 25 on the electrodes 12 and 22 for connection using an adhesive have an average thickness Tm of the same value (i.e., an average thickness Tm of 0.3 µm), the organic films 15 and 25 may have different average thicknesses Tm. Specifically, the organic film 15 may have an average thickness Tm of 0.3 µm, and the organic film 25 may have an average thickness Tm of 0.2 µm.

EXAMPLES

The present invention will be described below on the basis of examples and comparative examples. The present invention is not limited to these examples. These examples may be modified or altered on the basis of the purpose of the invention. The modifications and alterations are not excluded from the scope of the invention.

Example 1

Preparation of Adhesive

Straight-chain fine nickel particles were used as electrically conductive particles, the major axis L being in the range of 1 µm to 10 µm, and the minor axis R being in the range of 0.1 µm to 0.4 µm. Two types of bisphenol A-type solid epoxy resin [trade name: (1) Epikote 1256 and (2) Epikote 1004, manufactured by Japan Epoxy Resin Co. Ltd.] and a naphthalene-type epoxy resin [trade name: (3) EPICRON 4032D, manufactured by Dainippon Ink and Chemicals] were used as insulating thermosetting resins. Furthermore, a thermoplastic polyvinyl butyral resin [trade name: (4) S-LEC BM-1, manufactured by SEKISUI CHEMICAL CO., LTD.] was used. (5) A microencapsulated imidazole-type hardener [trade name: NOVACURE HX3941, manufactured by Asahi Kasei Epoxy Co., Ltd.] was used as a microencapsulated latent hardener. These components (1) to (5) were mixed in a weight ratio of (1)35/(2)20/(3)25/(4)10/(5)30.

The epoxy resins, the thermoplastic resin, and the latent hardener were dissolved or dispersed in cellosolve acetate. The resulting mixture was kneaded with three rolls, thereby preparing a solution having a solid content of 50% by weight. The Ni powder described above was added to the solution in such a manner that a metal-filling factor, which is indicated by the proportion of the metal in the total solid content (Ni powder+resins), was 0.05% by volume. Then the mixture was agitated with a centrifugal type agitating mixer to uniformly disperse the Ni powder, thereby preparing a composite material for an adhesive agent. The resulting composite material was applied with a doctor knife onto a polyethylene terephthalate (PET) film that had been subjected to treatment of parting. The applied composite material was dried and solidified at 60° C. for 30 minutes in a magnetic field having a magnetic flux density of 100 mT, thereby forming a 35-µm-thick anisotropic conductive film adhesive in which straight-chain particles in the film were oriented in the direction of the magnetic field.

(Production of Printed Wiring Board)

A flexible printed circuit board in which 30 electrodes for connection using an adhesive, the electrodes being copper electrodes each having a width of 150 µm, a length of 4 mm, and a height of 18 µm, were spaced at 150 µm, was prepared. Oxidation preventing films containing 2-phenyl-4-methyl-5-benzylimidazole were formed by OSP treatment on the electrodes for connection using an adhesive. The oxidation preventing films each had a decomposition temperature of 310° C. and an average thickness of 0.10 μm. The proportion of the area of a region having a thickness of 0.1 μm or less was 60%.
(Evaluation of Connection Resistance)

The flexible printed circuit board was subjected to solder reflow treatment at a peak temperature of 260° C. in a reflow tank having an oxygen concentration of 1% or less achieved by allowing nitrogen to flow. Then the flexible printed circuit boards were faced to each other in such a manner that a daisy chain in which connection resistances were able to be measured at continuous 30 points was formed. The resulting adhesive was arranged between the flexible printed circuit boards. The flexible printed circuit boards were bonded at 190° C. by pressing at a pressure of 5 MPa for 15 seconds, thereby producing a joint body of the flexible printed circuit boards. Next, in the joint body, resistances at the continuous 30 points connected through the electrodes for connection using an adhesive, the adhesive, and the electrodes for connection using an adhesive were determined by a four-terminal method. The resulting value was divided by 30 to determine a connection resistance per point. The evaluation was repeated 10 times, and then the average connection resistance was calculated. It was determined that when the connection resistance was 50 mΩ or less, the electrical conduction was ensured.
(Evaluation of Connection Reliability)

After the resulting connection body was placed in a high temperature and high humidity tank at 85° C. and 85% RH for 500 hr, the connection resistance was measured as described above. It was determined that when the rate of increase in connection resistance was 50% or less, the connection reliability was satisfactory.

Example 2

A joint body of flexible printed circuit boards was produced as in Example 1, except that the oxidation preventing films each had an average thickness of 0.20 μm and that the proportion of the area of a region having a thickness of 0.1 μm or less was 40%. Then the evaluation of the connection resistance and the evaluation of the connection reliability were made under conditions the same as those of Example 1.

Comparative Example 1

A joint body of flexible printed circuit boards was produced as in Example 1, except that oxidation preventing films containing 2-methylimidazole were formed on the electrodes for connection using an adhesive. The oxidation preventing films each had a decomposition temperature of 200° C. and an average thickness of 0.10 μm. The proportion of the area of a region having a thickness of 0.1 μm or less was 60%. Then the evaluation of the connection resistance and the evaluation of the connection reliability were made under conditions the same as those of Example 1.
(Measurement of Decomposition Temperature)

The decomposition temperature was measured with a differential scanning calorimetry (DSC). An exothermic onset temperature at a heating rate of 10° C./min is defined as a decomposition temperature.
(Thickness Measurement)

Cross sections of the electrodes for connection using an adhesive are observed, the electrodes being covered with the oxidation preventing films. The thicknesses were measured at intervals of 0.2 μm, and then the proportion of the area of a region having an average thickness of 0.1 μm or less is calculated.

TABLE

| | Initial connection resistance (mΩ) | Rate of increase in resistance (%) |
|---|---|---|
| Example 1 | 42 | 5 |
| Example 2 | 48 | 15 |
| Comparative Example 1 | Open | — |

Table shows the results of the evaluations of the connection resistance and the connection reliability in Examples 1 and 2 and Comparative Example.

As shown in Table, in each of the Examples 1 and 2, the initial connection resistance is 50 mΩ or less. The connection resistance is sufficiently small, which is satisfactory. Furthermore, in each of Examples 1 and 2, the rate of increase in resistance is 50% or less. This demonstrates that the connection reliability is also satisfactory.

In contrast, in Comparative Example 1, the initial connection resistance was open and thus could not be measured. So, the rate of increase in resistance is also unmeasurable. This is presumably because the oxidation preventing films in Comparative Example 1 were thermally decomposed during the solder reflow treatment, thereby causing the oxidation of the surfaces of the electrodes for connection using an adhesive.

A low initial connection resistance and a high connection reliability are obtained in Example 1 compared with those in Example 2. The results demonstrate that a smaller average thickness and a higher proportion of the area of a region having a thickness of 0.1 μm or less lead to, in particular, a higher connection reliability.

It should be understood that the structures of the embodiments disclosed herein are merely illustrative. The scope of the present invention is not limited to the scope of the description. The scope of the present invention is shown by the scope of the claims, and is intended to include all modifications within the equivalent meaning and scope of the claims.

INDUSTRIAL APPLICABILITY

The electrode structure, the wiring body, and the connecting structure using an adhesive of the present invention are usable for electrode structures and connection structures of members arranged in electronic appliances, such as cellular phones, cameras, e.g., digital cameras and video cameras, portable audio players, portable DVD players, and portable notebook personal computers. Furthermore, a release sheet body forming a thick anisotropic conductive film adhesive of the present invention is usable for connection of various wiring boards, such as FPCs and rigid printed circuit boards (PCBs), and various electronic components.

REFERENCE SIGNS LIST

10 FPC
11 base film
12 electrode for connection using adhesive
13 coverlay
15 organic film
20 mother board
21 rigid substrate
22 electrode for connection using adhesive
25 organic film
26 electrode for connection using solder
30 adhesive
31 resin composition
36 electrically conductive particles 40 electronic component
41 chip
42 chip-side electrode (connection conductor)
50 solder layer

CITATION LIST

Patent Literature

Patent Literature 1: Japanese Unexamined Patent Application Publication No. 10-79568

The invention claimed is:

1. An electrode structure to be electrically connected to a connection conductor by being bonded thereto with an adhesive mainly composed of a thermosetting resin, comprising:
an electrode for connection using an adhesive, the electrode being arranged on a base material; and
an organic film serving as an oxidation preventing film configured to cover a surface of the electrode for connection using an adhesive, wherein:
the organic film has a higher decomposition temperature than the maximum temperature of heat treatment to be performed,
the organic film has an average thickness of 0.05 μm to 0.5 μm, and
the organic film is formed of any of 2-phenylimidazoles and benzimidazoles.

2. The electrode structure according to claim 1, wherein the heat treatment is solder reflow processing.

3. The electrode structure according to claim 1, wherein the adhesive is an anisotropic conductive adhesive containing electrically conductive particles.

4. The electrode structure according to claim 1, wherein the organic film has a decomposition temperature of 300° C. or higher.

5. The electrode structure according to claim 1, wherein the organic film contains an organic compound having a coordinating atom capable of forming a coordinate bond with a metal constituting the electrode for connection using an adhesive.

6. The electrode structure according to claim 1, wherein the area of a region of the organic film having a thickness of 0.1 μm or less accounts for 30% or more of the total area of the organic film.

7. A wiring body comprising:
the electrode structure according to claim 1, and
a wiring member provided with the electrode structure.

8. A connecting structure using an adhesive, comprising the electrode for connection using an adhesive of the electrode structure according to claim 1, and a connection conductor, the electrode and the connection conductor being connected to each other using an adhesive,
wherein a portion of the electrode for connection using an adhesive and a portion of the connection conductor are conductive with each other without being covered with the organic film.

9. The wiring body according to claim 7, wherein the wiring member is a flexible printed circuit board.

10. The connecting structure using an adhesive according to claim 8, wherein the connection conductor is an electrode for connection using an adhesive, wherein the electrode for connection using an adhesive is covered with the organic film serving as an oxidation preventing film.

11. The connecting structure using an adhesive according to claim 8, wherein the adhesive is an anisotropic conductive adhesive containing electrically conductive particles, and
a portion of the electrode for connection using an adhesive and a portion of the connection conductor are conductive with each other through the electrically conductive particles.

12. An electronic appliance comprising:
a common base material including
the connecting structure using an adhesive according to claim 8, and
a connecting structure using solder, wherein the connecting structure using solder includes conductors that are electrically connected to each other by joining the conductors using solder.

13. The connecting structure using an adhesive according to claim 11,
wherein the adhesive contains electrically conductive particles formed of needle-shaped metal powder particles or a metal powder having a form in which a plurality of metal particles are connected in the form of a chain.

14. The connecting structure using an adhesive according to claim 11, wherein the adhesive has a film-like shape.

15. An assembling method of the electronic appliance according to claim 12, comprising:
a step A of covering the electrode for connection using an adhesive and the conductor for connection using solder on the base material with the organic film having a higher decomposition temperature than a solder reflow temperature;
a step B of joining the conductor for connection using solder to a connection conductor by solder reflow treatment in a non-oxidizing atmosphere; and
a step C of bonding the electrode for connection using an adhesive to a connection conductor with the adhesive by heat and pressure treatment.

16. The connecting structure using an adhesive according to claim 13, wherein each of the electrically conductive particles has an aspect ratio of 5 or more.

17. The connecting structure using an adhesive according to claim 14, wherein the adhesive contains electrically conductive particles whose major axes are oriented in the thickness direction of the adhesive having a film shape.

18. The assembling method of an electronic appliance according to claim 15, further comprising:
before the step B, a step D of forming a protective film on the organic film; and
after the step B and before the step C, a step E of removing the protective film.

* * * * *

UNITED STATES PATENT AND TRADEMARK OFFICE
CERTIFICATE OF CORRECTION

PATENT NO. : 8,766,437 B2
APPLICATION NO. : 13/060845
DATED : July 1, 2014
INVENTOR(S) : Yamamoto et al.

It is certified that error appears in the above-identified patent and that said Letters Patent is hereby corrected as shown below:

On the Title Page

Column 1, Item 73: change "Sumitomo Electric Industries, Ltd., Osaka (JP)" to "Sumitomo Electric Industries, Ltd., Osaka-shi, Osaka (JP)"

Signed and Sealed this
Fourteenth Day of October, 2014

Michelle K. Lee
*Deputy Director of the United States Patent and Trademark Office*